(12) United States Patent
Visser

(10) Patent No.: US 10,615,777 B2
(45) Date of Patent: *Apr. 7, 2020

(54) ON-CHIP BALUN CIRCUIT AND MULTI-PORT ANTENNA SWITCH CIRCUIT

(71) Applicant: Qorvo International PTE. LTD., Singapore (SG)

(72) Inventor: Hendrik Arend Visser, Wijchen (NL)

(73) Assignee: Qorvo International PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 16/281,152

(22) Filed: Feb. 21, 2019

(65) Prior Publication Data

US 2019/0181841 A1 Jun. 13, 2019

Related U.S. Application Data

(63) Continuation of application No. 15/781,926, filed as application No. PCT/NL2015/050848 on Dec. 7, 2015, now Pat. No. 10,270,427.

(51) Int. Cl.
| | | |
|---|---|---|
| *H04B 1/44* | (2006.01) | |
| *H04M 1/00* | (2006.01) | |
| *H03H 11/32* | (2006.01) | |
| *H03H 11/34* | (2006.01) | |
| *H01Q 7/00* | (2006.01) | |
| *H01P 5/10* | (2006.01) | |
| *H03H 7/42* | (2006.01) | |
| *H01F 17/00* | (2006.01) | |

(52) U.S. Cl.
CPC ............... *H03H 11/32* (2013.01); *H01P 5/10* (2013.01); *H01Q 7/00* (2013.01); *H03H 7/42* (2013.01); *H03H 11/34* (2013.01); *H04B 1/44* (2013.01); *H01F 2017/0073* (2013.01); *H01F 2017/0086* (2013.01)

(58) Field of Classification Search
CPC ... H04B 1/04; H04B 1/16; H04B 1/40; H04B 1/44; H04B 1/48; H04B 7/04; H04M 1/00; H04W 88/02
USPC ........ 455/78, 82, 83, 552.1, 553.1; 343/842, 343/855, 859, 866, 893
See application file for complete search history.

(56) References Cited

U.S. PATENT DOCUMENTS 6,009,314 A 12/1999 Bjork et al.
6,332,071 B1 12/2001 Brandt
(Continued)

OTHER PUBLICATIONS

Jakes, William C., et al., "Microwave Mobile Communications," Chapters 5 & 6, Lucent Technologies, Wiley-Interscience, 1974, pp. 309-549.

(Continued)

*Primary Examiner* — Quochien B Vuong
(74) *Attorney, Agent, or Firm* — Withrow & Terranova, P.L.L.C.

(57) ABSTRACT

Balun circuitry with a transceiver loop, a first antenna loop, and a second antenna loop is disclosed. The first antenna loop, the second antenna loop, and the transceiver loop are coaxially positioned such that the first antenna loop and the second antenna loop are coupled in opposite phase to the transceiver loop. In at least one exemplary embodiment, a semiconductor substrate has a layer that includes the first antenna loop, the second antenna loop, and the transceiver loop.

20 Claims, 5 Drawing Sheets

(56) References Cited

U.S. PATENT DOCUMENTS

| | | | |
|---|---|---|---|
| 6,707,367 B2 | 3/2004 | Castaneda et al. | |
| 6,735,418 B1 | 5/2004 | MacNally et al. | |
| 6,801,114 B2 | 10/2004 | Yang et al. | |
| 6,882,228 B2 | 4/2005 | Rofougaran | |
| 7,075,386 B2 | 7/2006 | Kearns | |
| 7,203,465 B2 * | 4/2007 | Kuramochi | H04B 1/408 455/83 |
| 7,274,913 B2 | 9/2007 | Marholev et al. | |
| 7,417,515 B2 | 8/2008 | Chominski | |
| 7,859,359 B2 | 12/2010 | Rofougaran | |
| 7,944,268 B2 * | 5/2011 | Okanobu | H03K 17/162 327/389 |
| 8,068,795 B2 | 11/2011 | Bavisi et al. | |
| 8,264,297 B2 | 9/2012 | Thompson | |
| 8,368,481 B2 | 2/2013 | Jin et al. | |
| 8,374,565 B2 * | 2/2013 | Kwon | H04B 7/0814 455/277.1 |
| 8,427,388 B2 | 4/2013 | Fahs et al. | |
| 8,681,070 B2 | 3/2014 | DiNallo et al. | |
| 8,855,581 B2 | 10/2014 | Rofougaran et al. | |
| 9,288,031 B2 | 3/2016 | Rousu et al. | |
| 2003/0137383 A1 | 7/2003 | Yang et al. | |
| 2005/0052245 A1 | 3/2005 | Rofougaran | |
| 2008/0158087 A1 | 7/2008 | Rofougaran | |
| 2010/0148866 A1 | 6/2010 | Lee et al. | |
| 2011/0273355 A1 | 11/2011 | Ahn et al. | |
| 2012/0013417 A1 | 1/2012 | Soman | |
| 2012/0064835 A1 | 3/2012 | Wang et al. | |
| 2012/0075019 A1 | 3/2012 | Visser et al. | |
| 2012/0083224 A1 | 4/2012 | Visser et al. | |
| 2012/0129468 A1 | 5/2012 | Maimon et al. | |
| 2013/0265132 A1 | 10/2013 | Huang et al. | |
| 2014/0087672 A1 | 3/2014 | Mostov et al. | |
| 2014/0139298 A1 | 5/2014 | Kim et al. | |

OTHER PUBLICATIONS

International Search Report and Written Opinion for PCT/NL2015/050848, dated Sep. 5, 2016, 12 pages.

Written Opinion for International Patent Application No. PCT/NL2015/050848, dated Nov. 13, 2017, 9 pages.

International Preliminary Report on Patentability for PCT/NL2015/050848, dated Mar. 16, 2018, 11 pages.

Notice of Allowance for U.S. Appl. No. 15/781,926, dated Dec. 3, 2018, 8 pages.

* cited by examiner

ON-CHIP BALUN CIRCUIT AND MULTI-PORT ANTENNA SWITCH CIRCUIT

RELATED APPLICATIONS

This application is a continuation of U.S. patent application Ser. No. 15/781,926, filed Jun. 6, 2018, now patented as U.S. Pat. No. 10,270,427 on Apr. 23, 2019, which is a 35 USC 371 national phase filing of PCT/NL2015/050848, filed Dec. 7, 2015, the disclosures of which are incorporated herein by reference in their entireties.

FIELD OF THE DISCLOSURE

The present disclosure relates to a balun circuit (BALanced-to-UNbalanced converter) which is configured in an on-chip design. In a further aspect, the present disclosure relates to a multi-port antenna switch circuit comprising such a balun circuit.

BACKGROUND

American U.S. Pat. No. 6,707,367 discloses an on-chip multiple tap transformer balun having a first winding coupled to a second winding in different on-chip layers. The second winding has a first node, a second node and a center tap, and first and second portions between the center tap and first node and second node, respectively. The first and second portions of the second winding are symmetrical and arranged in one layer, to provide a similar coupling to the first winding.

American patent publication US2003/137383 discloses a transformer balun with a symmetrical structure, having primary and secondary metal windings at separate layers. The windings can be provided with a center tap, for example, for connection to ground, which allows a winding to be used as a differential port.

American patent publication US2005/052245 discloses an RF integrated circuit having an antenna diversity structure. Two antenna inputs are connected to corresponding (separate) transformer baluns and from there to two low noise amplifier inputs or two power amplifier outputs. For the transformer baluns used reference is made to American patent publication U.S. Pat. No. 6,882,263 having coupled windings in separate layers.

SUMMARY

Balun circuitry with a transceiver loop, a first antenna loop, and a second antenna loop is disclosed. The first antenna loop, the second antenna loop, and the transceiver loop are coaxially positioned such that the first antenna loop and the second antenna loop are coupled in opposite phase to the transceiver loop. In at least one exemplary embodiment, a semiconductor substrate has a layer that includes the first antenna loop, the second antenna loop, and the transceiver loop.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The present disclosure will be discussed in more detail below, using a number of exemplary embodiments, with reference to the attached drawings, in which FIGS. 1A-C shows schematic top views of various embodiments of the balun circuit of the present disclosure;

DETAILED DESCRIPTION

Figure 1A:
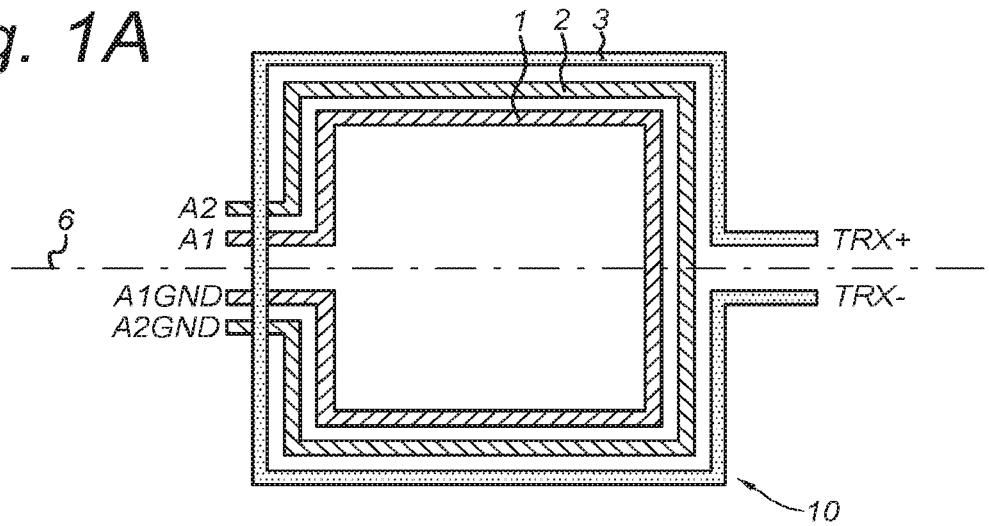

The present disclosure embodiments relate to a balanced-to-unbalanced converter circuit, also designated as balun circuit, which is part of an integrated circuit design. The balun circuit according to the present disclosure embodiments as described herein, is especially useful for application in a multi-port antenna switch circuit, as also described herein in a number of exemplary embodiments, but may also be used in other applications. A balun circuit with multiple windings for multiple similar outputs (such as described below for two antennae) can be used for other applications than antenna switching as well. For example, such a balun circuit can be used to split a transmit signal into two equal paths and feed it into two differential amplifiers that are either combined later or not. Each amplifier can be scaled differently or a different phase delay can be applied to each amplifier.

The disclosed embodiments have particular application in the field of ultra-low power sensor networks, but is also applicable for any wireless application that uses antenna diversity and is constrained by a power budget and cost, for example, ZigBee, Bluetooth, DECT, GSM, and WiFi (non-MIMO standards). Sensor nodes are often required to run on a coin-cell battery for several years, which requires an ultra-low power implementation. Furthermore, the total cost of the sensor node should be very low. The cost of the sensor node is usually proportional to the amount of silicon area of the integrated circuit in combination with the chosen process technology and the amount of discrete components needed. Despite all these constraints, the sensor nodes should have a high sensitivity and at the same time be robust against interferers.

In many applications, antenna diversity is therefore used to improve the link budget and reliability against interferers. With multipath fading conditions a link budget improvement of 10 dB can be expected from a two (or more) antennae systems with an antenna diversity circuit. One condition for optimum antenna diversity gain is that the individual signals of each antenna are uncorrelated. Therefore, isolation between the antennas is an important design criteria. Another important aspect of antenna diversity, is the selection mechanism that is implemented. For a packet-based radio system like ZigBee (often used for wireless sensor networks), the preamble duration of the packet can be used to determine the optimum antenna. However, since the preamble is in the order of tens of microseconds, fast switching between antennas is necessary.

The present disclosure embodiments as described herein offer a new way of implementing antenna diversity which minimizes the cost of implementation while at the same time achieving good performance due to the absence of insertion loss, proper isolation between antennas and fast switching speeds.

From the prior art, transmit/receive combination methods and circuits are known which are sometimes referred to as antenna switching. However, that is not what this disclosure is about, as the switching part of the circuit is limited to an on-chip part relating to switching between a receiver and a transmitter path. If multiple antennae are used, the switching between antennae is usually implemented in an off-chip circuit. Indeed, such prior art transmit/receive switching circuit allows to combine a receive (RX) input signal and a transmit (TX) output signal into one integrated circuit pad.

A main reason of not integrating an antenna switch in deep-submicron CMOS technology is the power handling capability in transmit mode. The well diodes of a transistor switch (source/drain to bulk) will rectify the transmit signal starting at 0.7 Vp. The solution used in many prior art applications is to put the switch externally. A dedicated process can be used for the switch and power handling is not an issue any more. The control of the switch can still be implemented from the integrated circuit (on-chip) requiring an additional pad. This will cost one extra pin to control the switch next to the cost and the placement of the external switch on a printed circuit board or the like. Another known solution (see, for example, US2005/052245 discussed in the prior art section above) is to avoid antenna switching by integrating two RF sections of the transceiver chains or a complete transceiver chain. No antenna switch is needed, at the cost of chip area as two partial receivers, two partial transmitters and two transmit/receive (TRX) switches are integrated.

Figure 1B:
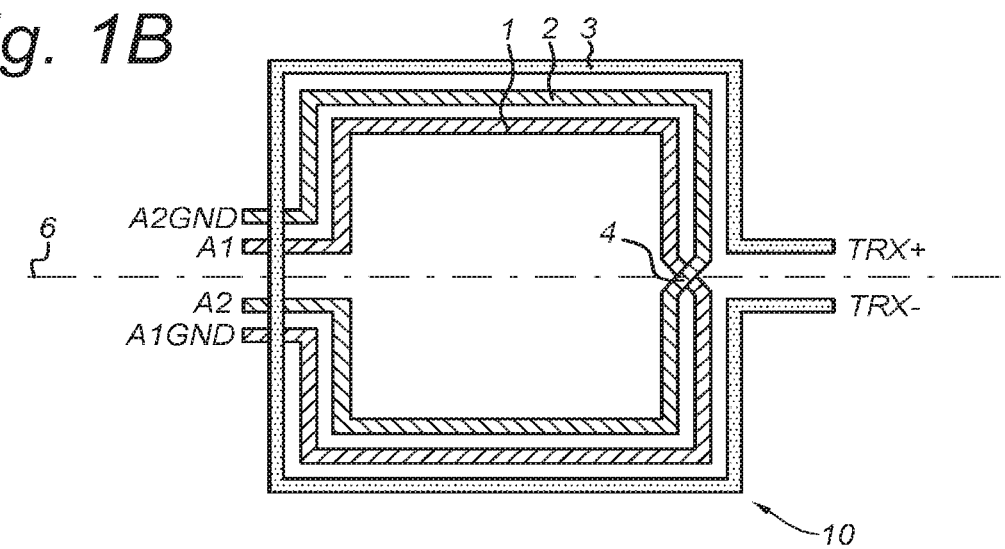
Figure 1C:
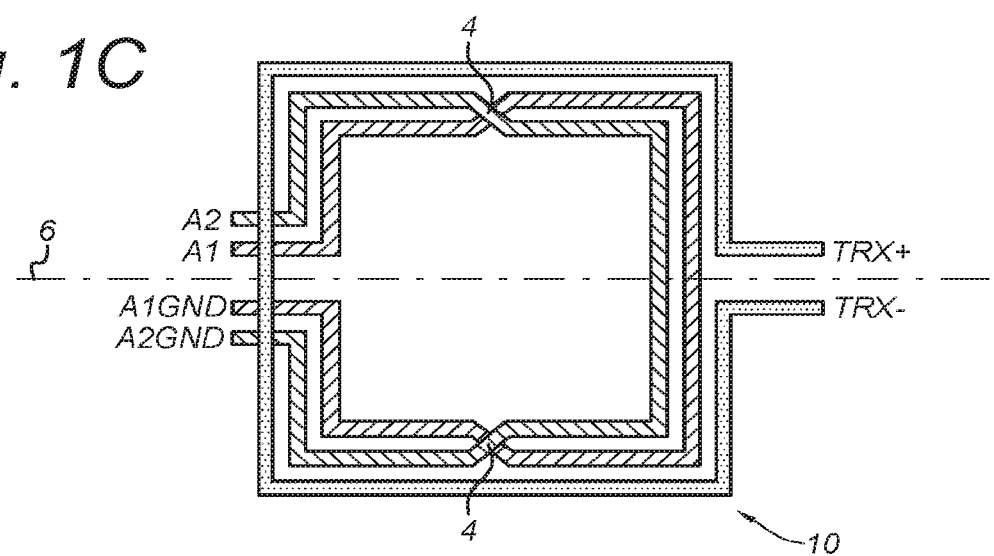

A first group of embodiments of the present disclosure relates to a balun circuit that integrates a split antenna winding to support two antennae. A further split can support more antennae. In general wording, the present disclosure relates to a balun circuit 10 which is configured in an on-chip design, comprising a transceiver loop 3 having a positive and a negative transceiver signal terminal TRX+, TRX−, a first antenna loop 1 and at least one further antenna loop 2. Each antenna loop 1, 2 has a ground terminal A1GND; A2GND and an antenna signal terminal A1, A2. The first antenna loop 1, the at least one further antenna loop 2, and the transceiver loop 3 are coaxially positioned in one (metal) layer of the on-chip design. Such a balun circuit can be easily integrated in an on-chip part of an integrated circuit, such as an antenna switch circuit. It is noted that for an on-chip design, the thickness of (metal) layers can vary, and for example the top layer(s) can be implemented as thicker metal layers. These thicker metal layers would provide a better conductivity and hence better performance of the balun circuit. FIGS. 1A-C show schematic top views of various embodiments of such a balun circuit 10 according to the present disclosure, which can be integrated in an on-chip part of an integrated circuit.

The exemplary embodiment shown in FIG. 1A shows an asymmetrical balun circuit 10, where the at least one further antenna loop 2 is next to the transceiver loop 3 and thus will couple stronger to the transceiver loop 3 than the first antenna loop 1. It is noted that capacitive coupling will start to dominate for higher frequencies and different harmonic levels can be expected at the outputs.

In the exemplary embodiment shown in FIG. 1B, a crossing 4 is introduced half way. Or in generic terms, the first antenna loop 1 and the at least one further antenna loop 2 have at least one mutual crossing 4. The crossing can, for example, be implemented as an electrical conducting bridge, or via a further layer in the on-chip design.

Furthermore, it is shown that the balun circuit 10 comprises a symmetry line 6. In this embodiment, the antenna signals couple equally. The terminals A1; A2 are now next to each other and the ground terminals A1GND; A2GND on top and bottom. This can be exchanged so that the ground and A1GND; A2GND are near each other and one shared pad can be used. The first and at least one further antenna loops 1, 2 are coupled to transceiver loop 3 with opposite phase. This can be exploited as a differential output with a four times higher output impedance. In that case antenna diversity is sacrificed in favor of one differential antenna (see also the embodiment of FIG. 7 described below).

Having one crossing 4 makes the antenna loops 1, 2 slightly different. A crossing 4 adds resistance. This can be compensated by a narrower line for the antenna loop 1, 2 which is implemented in the same metal layer as the entire loop 1, 2 (see description of FIG. 6 below).

FIG. 1C shows a further embodiment, having two symmetrically positioned crossings 4. Now both antenna signal terminals A1, A2 are next to each other and both ground terminals A1GND; A2GND are next to each other. The 180 degrees phase difference is not present in this embodiment (and therefore this embodiment of the balun circuit 10 can't be used as a single differential antenna output).

In general, good balun circuits 10 with two antenna loops 1, 2 have a symmetrical layout, and advantageously even a symmetrical winding configuration. Furthermore, a crossing 4 half way the loops 1, 2 will provide the same coupling to neighboring loops (the transceiver loop 3 in the embodiments shown). And even further connections at one side for each loop 1, 2, 3 is also advantageous, or in other words, the ground terminal A1GND; A2GND and antenna signal terminal A1, A2 are located on one side of the balun circuit 10, and the positive and negative transceiver signal terminal TRX+, TRX− are located on an opposite side of the balun circuit 10.

Figure 6:
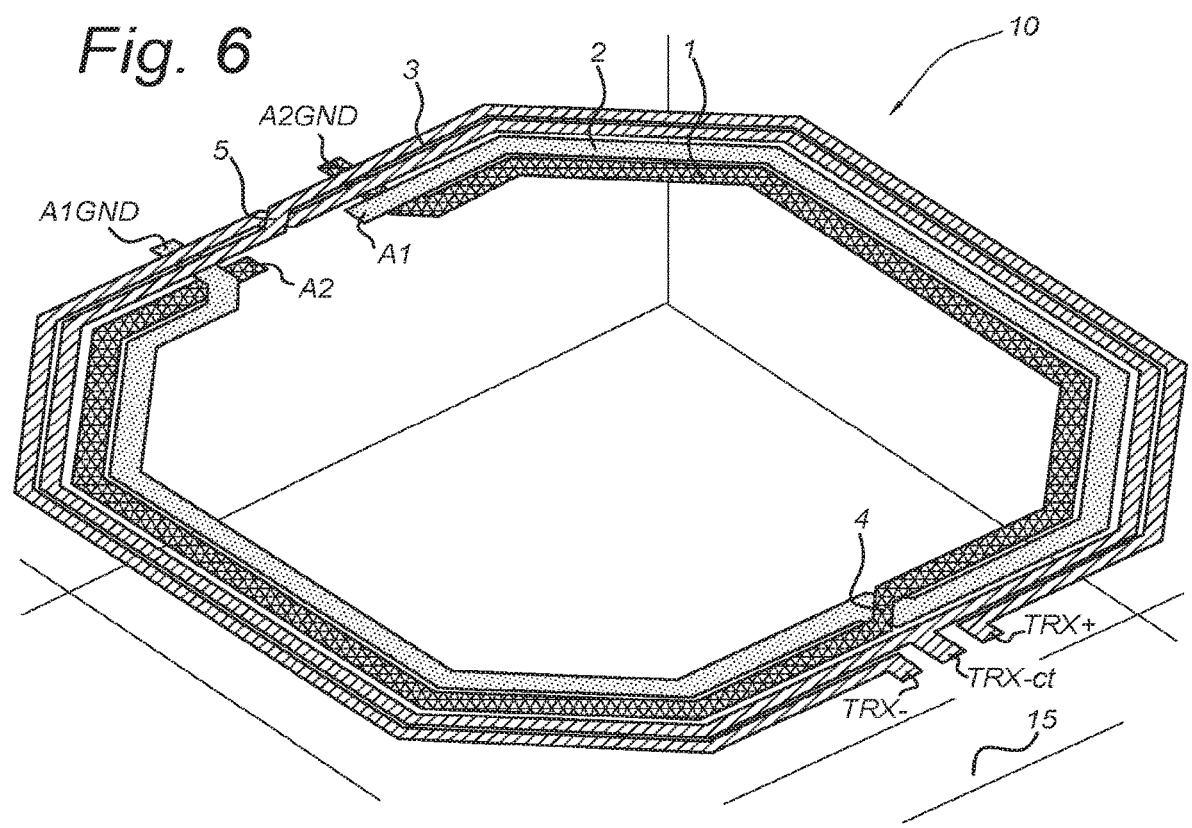
FIG. 6 shows a three dimensional view of a balun circuit as part of an integrated circuit.

FIG. 6 shows a three dimensional view of a balun circuit 10 as part of an integrated circuit implemented in a semiconductor substrate 15. In this embodiment, the first antenna loop 1 and at least one further antenna loop 2 have a similar lay-out as the embodiment of FIG. 1B including a crossing 4 half way (be it with cut-off corners, that is, octagonal shaped loops 1-3). The crossing 4 can be implemented using a connecting path in another layer (in the embodiment shown for the crossing part in the at least one further loop 2), and a somewhat narrower loop path in the (metal) layer wherein the balun circuit 10 is formed (that is, in the first antenna loop 1 of the embodiment shown in FIG. 6). As a result of the crossing 4 being half way the antenna loops 1, 2, both antenna loops 1, 2 are for 50% close to the transceiver loop 3 and 50% further away from the transceiver loop 3. This causes symmetrical coupling which is one of the parameters needed for antenna switches.

Furthermore, in this embodiment, the transceiver loop 3 has multiple (two) windings and at least one crossing 5 for each winding, thus providing a symmetry of coupling coefficients, and a higher coupling coefficient. Also, as a further embodiment, the transceiver loop 3 further has a center tap terminal TRX-ct, in this case exactly half way the transceiver loop 3. In many applications, a center tap in the transceiver loop is very advantageous, for example, for providing a DC bias.

In even further embodiments, the transceiver loop 3 may comprise a transmission loop and a receiver loop. One common denominator is to have both antenna loops 1, 2 in a symmetrical layout, and to have the transmission loop and the receiver loop different from each other. The symmetry line can be any angle, even a diagonal is possible. To limit the number of crossings 4, 5, and to improve isolation between the transmission loop and receiver loop, the antenna loops 1, 2 are, for example, placed in the middle with the transmission loop outside and the receiver loop inside. Or even more generic, the transceiver loop 3 may surround the first antenna loop 1 and the at least one further antenna loop 2. The receiver loop can thus be on the inside, where the transceiver loop is then on the outside. This can be swapped as well. The convenient aspect is that the antenna loops 1, 2 are in the middle, and will couple good with either the receiver or transmission loop, while direct coupling from receiver loop to transmission loop is less good. In an exemplary embodiment, the configuration is much alike that shown in FIG. 6; however, the connections for the receiver winding and transmitter winding are then separated at one side of the balun circuit, for example, at angles of 110° and 160°.

It is noted that the embodiments shown in FIGS. 1A-C, and the antenna loops 1, 2 in the embodiment of FIG. 6 have only one turn for each loop (or winding). However, each of the loops 1-3 can have multiple turns (as is the case for transceiver loop 3 for the FIG. 6 embodiment).

Figure 2:
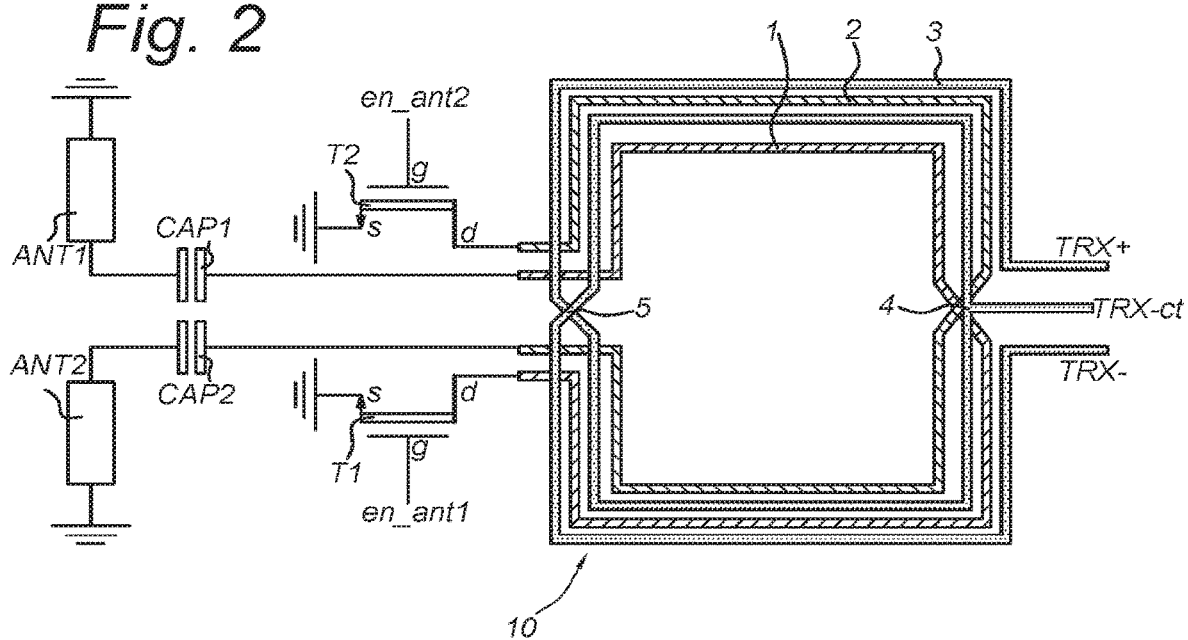
FIG. 2 shows a circuit diagram of a multi-port antenna switch circuit according to an embodiment of the present disclosure.

FIG. 2 shows a circuit diagram of a multi-port antenna switch circuit according to an embodiment of the present disclosure, wherein an embodiment of the balun circuit 10 according to the present disclosure is connected to two antennae ANT1, ANT2. In this specific embodiment, a balun circuit 10 is applied according to the embodiment described above with reference to FIG. 6 (having a center tap terminal TRX-ct in the transceiver loop 3). Furthermore, a first switch T1 is connected between a ground terminal A1GND of the first antenna loop 1 and a ground connection, and a second switch T2 is connected between a ground terminal A2GND of the at least one further antenna loop 2 and the ground connection. The switches T1, T2 are implemented as field effect transistors having a gate g, a source s and drain d, as well known in the art, allowing a switching action using signals en_ant1 and en_ant2 on the respective gates.

Furthermore, a first coupling capacitor CAP1 is connected between the first antenna signal terminal A1 of the balun circuit 10 and the first antenna ANT1, and a second coupling capacitor CAP2 is connected between the at least one further antenna signal terminal A2 of the balun circuit and the second antenna ANT2.

In a multi-port antenna switching circuit, the main problem to solve is rectification of large RF transmitter signals in the antenna switch resulting in a DC voltage that is dissipated in the switch or the load. Rectification to a DC voltage means that the large RF transmit signal is not arriving at the antenna.

Figure 3A:
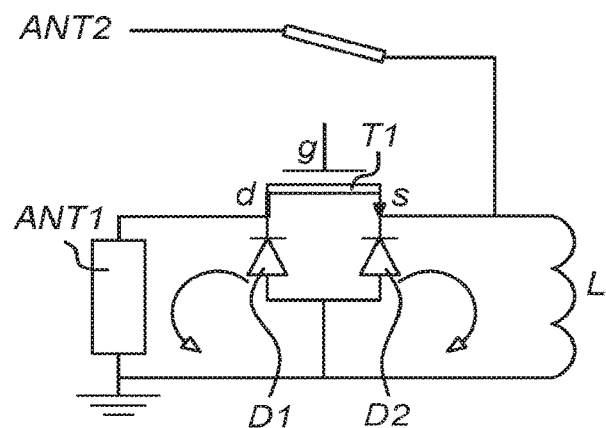
FIG. 3A shows a partial circuit diagram of a prior art antenna switching circuit and FIG. 3B shows a partial circuit diagram of an antenna switch circuit as used in the present disclosure embodiments.
Figure 3B:
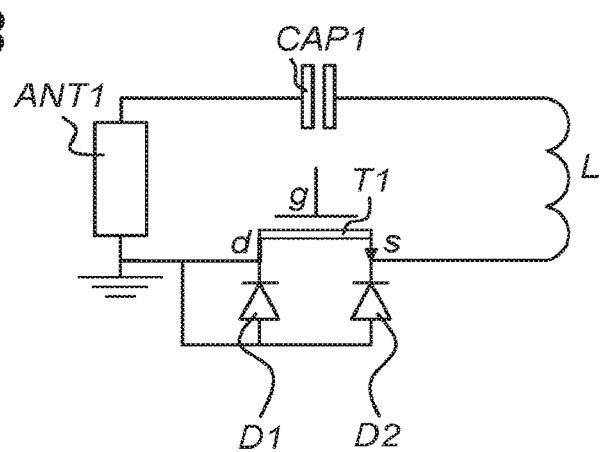

The antenna switch T1, T2 in a deep sub-micron CMOS process is either a PMOS or an NMOS embodiment. In either case the antenna switch T1, T2 has parasitic diodes D1, D2 from source and drain to its well (forming the rectification device. These diodes D1, D2 limit the use of a PMOS or NMOS as antenna switch T1, T2 to small signals, where the transmitter power is severely limited. FIGS. 3A and 3B show partial circuit diagrams of a prior art antenna switching circuit and an antenna switch circuit as used in the present disclosure embodiments, where this phenomenon is clarified. The parasitic diodes D1, D2 are always there and create a short in one direction across the 50 Ohm load (antenna ANT1) and the coil L (part of the balun circuit 10 is discussed above) as shown by the arrows. A power level up to about 0.7 V is the maximum as this silicon diodes D1, D2 will start rectifying (actually it is −0.7 V or lower). A voltage of 0.7 V peak at 50 Ohm is 5 mW or +7 dBm. When one wants to transmit +20 dBm this will definitely cause rectification, which will be apparent as a DC current. As long as the DC current can flow, the RF power will be rectified and dissipated in this circuit of diodes D1, D2, coil L and resistance formed by antenna ANT1.

A possible solution would be to put AC-coupling in series with the switch T1, T2 (both resistance and coil) to stop the dissipation. This will cause the source and drain to be charged (by rectification) until the amplitude of the RF signal is not large enough to cross the diode barrier. At this point the rectification has stopped; however, there is a new problem. The source/drain voltages have gone up in voltage proportionally to the RF amplitude (which can be 2 V, for example) and now the NMOS device (antenna switch T1, T2) is switched off, because the gate voltage has not increased in the same way.

The solution as provided in the present disclosure embodiment is to move the switch T1, T2 to the bottom to the inductor L and put an AC coupling in series (implemented using coupling capacitors CAP1 and CAP2, see FIG. 2). This is shown in the detailed view of FIG. 3B.

It is noted that a further feature of the present disclosure balun circuit 10 is to have the connection terminals for the antenna loops 1, 2 (A1, A2, A1GND, A2GND) at one side, allowing to add the NMOS switches T1, T2 under or next to (outside) the loops 1-3 of the balun circuit 10 (in the substrate 15, see embodiment of FIG. 6).

This will result in two possible scenarios:

The switch T1, T2 is closed: A short is created by the NMOS switch T1, T2 between the drain-source to ground. There is no issue any more with the diode causing rectification.

The switch is open: The diode D2 between source and ground can cause rectification; however, the AC coupling blocks DC current. The source will be charged to a higher value (for example, 2 V). This is okay, and actually the isolation improves as the switch T1 is now more off The only requirement is that the NMOS antenna switch T1 can handle a high enough voltage.

Thus according to the present disclosure embodiments, by adding a second antenna loop 2 on the balun circuit 10 (having hardly any area impact), and adding a switch T1, T2 in the ground path, there is good power handling capability (when power is needed, the switch is closed, and in open case there is no DC path, allowing rectification. In a similar way a third and even further antenna loops can be added to obtain a multi-port antenna switch circuit.

Figure 4A:
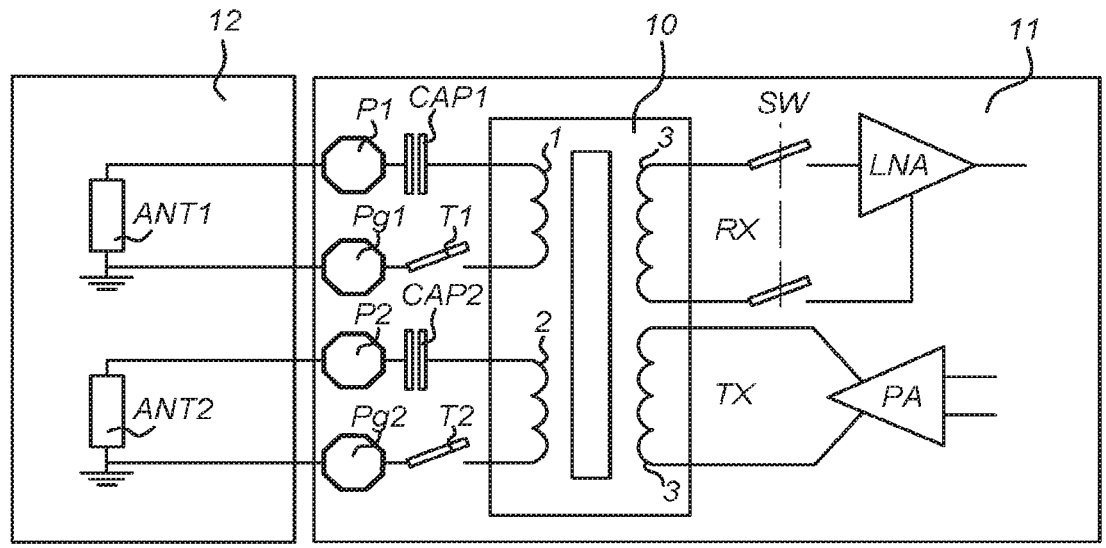
FIGS. 4A and 4B show schematic block diagrams of two embodiments of the multi-port antenna switch circuit according to the present disclosure.
Figure 4B:
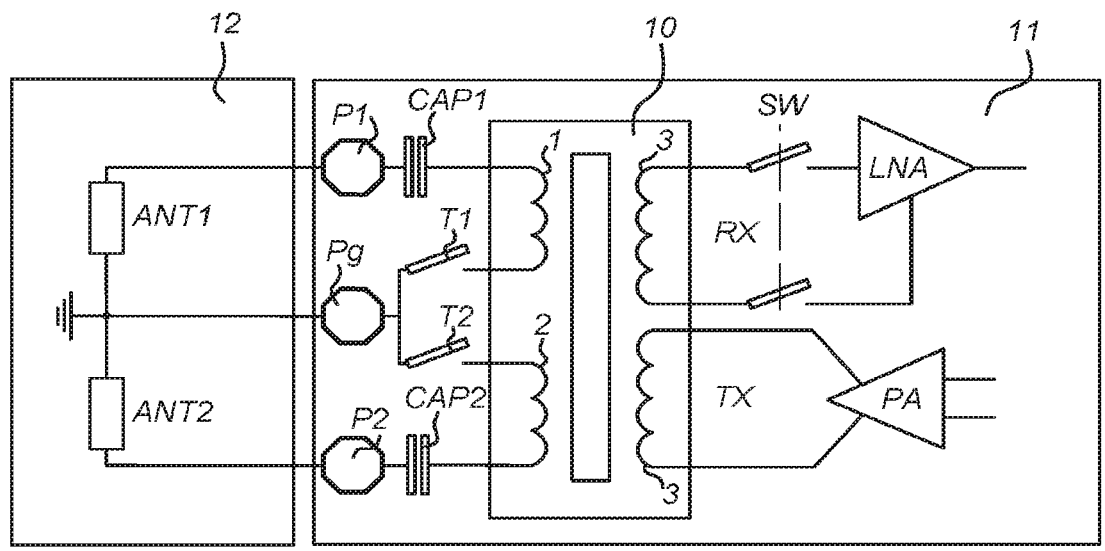

FIGS. 4A and 4B show schematic block diagram of two embodiments of the multi-port antenna switch circuit according to the present disclosure, which can be defined in general terms as a multi-port antenna switch circuit comprising a balun circuit 10 connected to a transceiver terminal set (for example, as shown in FIG. 2 with a differential connection terminals TRX+, TRX− as well as a center tap terminal TRX-ct), a first switch T1 connected between a ground terminal A1GND of the first antenna loop 1 and a first antenna external connection pad Pg 1, and a second switch T2 connected between a ground terminal A2GND of the at least one further antenna loop 2 and at least one further antenna external connection pad Pg2. As shown in the embodiment of FIG. 4A, the balun circuit 10 is further connected to a receiver switch SW and a low noise amplifier LNA as part of an integrated receiver part and to a power amplifier PA as part of an integrated transmitter circuit on an on-chip part 11. The on-chip circuit 11 furthermore comprises the antenna switches T1, T2, coupling capacitors CAP1, CAP2, and the connecting pads P1, Pg1, P2, Pg2. The only off-chip part 12 for such a transceiver configuration then are the actual antennae A1, A2.

In the further embodiment as shown in FIG. 4B, the first antenna external connection pad (Pg1) and the at least one further antenna external connection pad (Pg2) are integrated in a single external ground connection pad (Pg), to which the antenna switches T1, T2 are both connected. There is one pre-requisite for sharing the ground pad: The RF voltage across the connection from on-chip ground pad Pg to external ground should be low enough to guarantee a low enough isolation. The voltage across the ground connection will be superposed on the other inductor winding resulting in a reduced isolation.

As explained above, an AC coupling is provided in the antenna signal path of the multi-port antenna switch circuit. This is, for example, implemented using a first coupling capacitor CAP1 connected to an antenna signal terminal A1 of the first antenna loop 1, and a second coupling capacitor CAP2 connected to an antenna signal terminal A2 of the second antenna loop 2.

Figure 5:
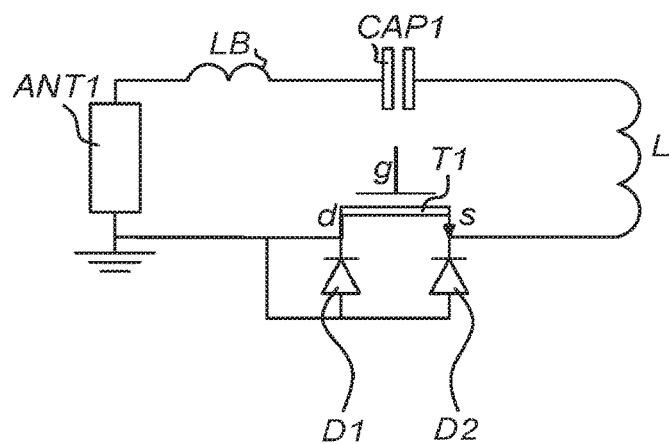
FIG. 5 shows an equivalent circuit diagram of a part of the embodiments of FIGS. 4A and 4B.

In the embodiments as shown in FIG. 4A and FIG. 4B, the first and second coupling capacitors CAP1, CAP2 are provided as on-chip capacitors, that is, integrated in the on chip part 11. Alternatively, the first and second coupling capacitor CAP1, CAP2 are provided as off-chip capacitors. FIG. 5 shows an equivalent circuit diagram of the upper (first antenna ANT1) part of the embodiments of FIGS. 4A and 4B: The ground connection of the first antenna ANT1 is connectable to a lower part of balun circuit 10 (shown as equivalent inductor L) via the first switch T1 (with parasitic diodes D1, D2). The signal terminal is connected to the upper terminal of the balun circuit 10 (inductor L) via first coupling capacitor CAP1, and a bond wire inductance LB, representing the lumped inductance of the (off-chip) connection wires to the first antenna ANT1. For the at least one further antenna ANT2 side, a similar equivalent circuit is present. The AC coupling capacitors CAP1, CAP2 which are included to overcome rectification can be tuned to a value such that is resonates with the bond wire inductance LB and both bond wire and capacitor CAP1, CAP2 become invisible at the RF frequency. Having the AC coupling capacitor CAP1, CAP2 in the off-chip part 12 provides the flexibility to package the on-chip part 11 in different sizes packages where the bond wire length, and thus the bond wire inductance LB, can be tuned out by proper selection of the coupling capacitors CAP1, CAP2. This means that only one chip with integrated antenna switch is needed and can serve multiple package sizes. This could be needed when the radio including antenna switch is re-used with different sized of digital.

In the embodiments of FIG. 4A and FIG. 4B, a balun circuit 10 is shown having four loops (or windings) 1-3, wherein the transceiver loop 3 comprises separate receiver and transmitter loops. For example, in the transmission part there may be a center tap providing a DC bias, while in RX there may be single ended inputs and only the return current needs to be kept local. Load and input impedance of TX and RX can be different in this way as well. As an alternative, instead of a balun circuit 10 having four loops, a balun circuit 10 having a transceiver loop 3 can be used.

Figure 7:
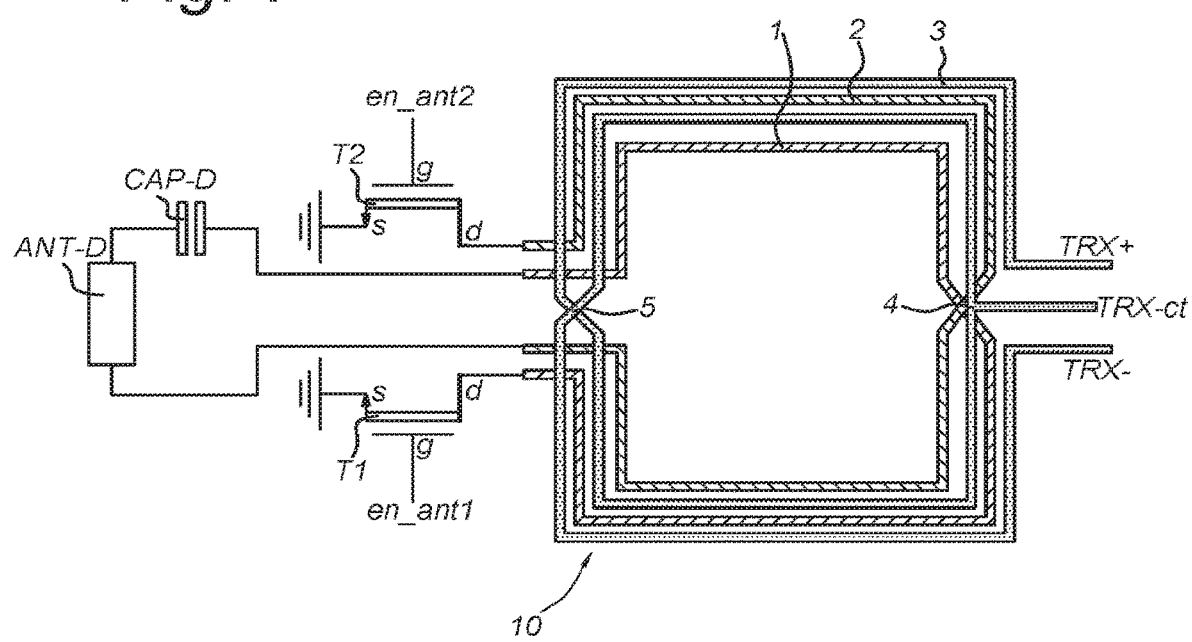
FIG. 7 shows a circuit diagram of a multi-port antenna switch circuit according to a further embodiment using a differential antenna connection.

FIG. 7 shows a circuit diagram of a multi-port antenna switch circuit according to an even further embodiment using a differential antenna connection. In this embodiment, the first and at least one further antenna loops 1, 2 of the balun circuit 10 are coupled to transceiver loop 3 with opposite phase. In this exemplary embodiment, antenna diversity is sacrificed in favor of one differential antenna, wherein the differential output has a four times higher output impedance: A single differential coupling capacitor CAP-D is connected to the antenna signal terminal A1, A2 of either the first antenna loop 1 or the second antenna loop 2. Although it is sufficient to use only a single coupling capacitor CAP-D, it would alternatively be possible to have two capacitors CAP-D for a more symmetric circuit. In this exemplary embodiment, the two antenna switches T1, T2 are operated synchronously; that is, both will be enabled at the same time.

The present disclosure embodiments have been described above with reference to a number of exemplary embodiments as shown in the drawings. Modifications and alternative implementations of some parts or elements are possible, and are included in the scope of protection as defined in the appended claims.

Those skilled in the art will recognize improvements and modifications to the preferred embodiments of the present disclosure. All such improvements and modifications are considered within the scope of the concepts disclosed herein and the claims that follow.

What is claimed is:

1. Balun circuitry comprising:
   a transceiver loop having a positive transceiver signal terminal and a negative transceiver signal terminal;
   a first antenna loop having a first antenna terminal at one end and a first switch terminal at another end; and
   a second antenna loop having a second antenna terminal at one end and a second switch terminal at another end, wherein the first antenna loop, the second antenna loop, and the transceiver loop are coaxially positioned such that the first antenna loop and the second antenna loop are coupled in opposite phase to the transceiver loop.

2. The balun circuitry of claim 1 wherein output impedance at the positive transceiver signal terminal and the negative transceiver signal terminal is at least four times greater than input impedance at the first antenna terminal and the second antenna terminal.

3. The balun circuitry of claim 1 further comprising:
   a first switch connected between the first switch terminal and a ground node; and
   a second switch connected between the second switch terminal and the ground node, wherein the first switch and the second switch are integrated with a semiconductor substrate having a layer comprised of the first antenna loop, the second antenna loop, and the transceiver loop.

4. The balun circuitry of claim 3 wherein the first switch and the second switch are both metal oxide semiconductor (MOS) transistors.

5. The balun circuitry of claim 4 wherein the first switch and the second switch are both NMOS transistors.

6. The balun circuitry of claim 4 wherein the first switch and the second switch are both PMOS transistors.

7. The balun circuitry of claim 3 wherein the first switch and the second switch are configured to be enabled simultaneously.

8. The balun circuitry of claim 3 further including a low noise amplifier (LNA) that is integrated with the semiconductor substrate and has an input communicatively connected to the transceiver loop.

9. The balun circuitry of claim 3 further including a power amplifier (PA) that is integrated with the semiconductor substrate and has an output communicatively connected to the transceiver loop.

10. The balun circuitry of claim 3 further including a first capacitor integrated with the semiconductor substrate and being coupled to the first antenna terminal.

11. The balun circuitry of claim 1 further including a differential antenna communicatively connected between the first antenna terminal and the second antenna terminal.

12. The balun circuitry of claim 1, wherein the first antenna terminal of the first antenna loop and the second antenna terminal of the second antenna loop are located on one side of the balun circuitry, and the positive transceiver signal terminal and negative transceiver signal terminal of the transceiver loop are located on an opposite side of the balun circuitry.

13. The balun circuitry of claim 1 wherein the first antenna loop and the second antenna loop have at least one mutual crossing.

14. The balun circuitry of claim 1 wherein the transceiver loop has multiple windings and at least one crossing for each winding.

15. The balun circuitry of claim 1 wherein the transceiver loop has a center tap terminal.

16. The balun circuitry of claim 1 wherein the transceiver loop comprises multiple windings having a transmission winding and a receiver winding.

17. The balun circuitry of claim 1 wherein the transceiver loop surrounds the first antenna loop and the second antenna loop.

18. The balun circuitry of claim 17 further including a second capacitor coupled to the second antenna terminal.

19. The balun circuitry of claim 18 further including a second capacitor integrated with the semiconductor substrate and being coupled to the second antenna terminal.

20. The balun circuitry of claim 1 further including a first capacitor coupled to the first antenna terminal.

\* \* \* \* \*